US006924068B2

(12) United States Patent
Ohnuma

(10) Patent No.: US 6,924,068 B2
(45) Date of Patent: Aug. 2, 2005

(54) PHOTOMASK FABRICATION METHOD, PHOTOMASK, AND EXPOSURE METHOD THEREOF

(75) Inventor: Hidetoshi Ohnuma, Kanagawa (JP)

(73) Assignee: Sony Corporation, Tokyo (JP)

( * ) Notice: Subject to any disclaimer, the term of this patent is extended or adjusted under 35 U.S.C. 154(b) by 382 days.

(21) Appl. No.: 09/982,305

(22) Filed: Oct. 17, 2001

(65) Prior Publication Data

US 2002/0045110 A1 Apr. 18, 2002

(30) Foreign Application Priority Data

Oct. 17, 2000 (JP) .................................... P2000-316803

(51) Int. Cl.[7] .................................................. G03F 9/00
(52) U.S. Cl. ............................................. 430/5; 430/30
(58) Field of Search ....................................... 430/5, 30

(56) References Cited

U.S. PATENT DOCUMENTS 5,707,765 A * 1/1998 Chen ............................. 430/5
5,895,736 A * 4/1999 Nakajima .................... 430/30
6,077,310 A 6/2000 Yamamoto et al.

FOREIGN PATENT DOCUMENTS

JP 08-264420 A 10/1996

OTHER PUBLICATIONS

Ohnuma H et al. "Lithography Computer Aided Design Technology for Embedded Memory Inlogic", Japanese Journal of Applied Physics, vol. 37, No. 12B, pp. 6686–6688, Dec. 1998, Publication Office Japanese Journal of Applied Physics, Tokyo.

Liebmann L. W. et al. "Optical Proximity Correction, a First Look at Manufacturability", 14th Annual Symposium on Photomask Technology and Management, vol. 2322, pp. 229–238, Santa Clara, CA Sep. 1994.

Ohnuma H et al. "Fast Chip Level OPC Method on Mask Database", Japanese Journal of Applied Physics, vol. 3096, pp. 145–153, 1997, Bellingham, VA US.

* cited by examiner

*Primary Examiner*—Saleha R. Mohamedulla
(74) *Attorney, Agent, or Firm*—Robert J. Depke; Holland & Knight LLP

(57) ABSTRACT

The present invention is a method capable of fabricating photomasks with improved control of gate line width wafers. More specifically a method is provided to determine a mask correction unit 3 based on pattern space dependency 7 in the pattern obtained in the photolithographic process and etching process, and correct the mask fabrication design data 1 utilizing the mask correction unit 3, and fabricate photomasks using photolithographic equipment.

13 Claims, 8 Drawing Sheets

FIG.2

SPACE $4_1$

GATE LINE WIDTH

| (μm) \ (μm) | 0.3μ | 0.4μ | 0.5μ | 0.6μ | |
|---|---|---|---|---|---|
| | | | | | |
| 0.2μ | 5 | 10 | 10 | 15 | |
| | | | | | |
| | | | | | |
| | | | | | |

FIG.3

SPACE $4_2$

GATE LINE WIDTH

| (μm) \ (μm) | 0.3μ | 0.4μ | 0.5μ | 0.6μ | |
|---|---|---|---|---|---|
| | | | | | |
| 0.2μ | 5 | 10 | 15 | 15 | |
| | | | | | |
| | | | | | |
| | | | | | |

43

SPACE

GATE LINE WIDTH

| (μm) \ (μm) | 0.25μ | 0.3μ | 0.35μ | 0.4μ | 0.5μ | 0.55μ |
|---|---|---|---|---|---|---|
| | | | | | | |
| 0.2μ | 2.5 | 5 | 7.5 | 10 | 12.5 | 15 |
| | | | | | | |
| | | | | | | |
| | | | | | | |

--------------------31------------------

--------------------35-----------------

PRECORRECTION

POSTCORRECTION

PHOTOMASK FABRICATION METHOD, PHOTOMASK, AND EXPOSURE METHOD THEREOF

BACKGROUND OF THE PRESENT INVENTION

The present invention relates to a photomask fabrication method and photomask used for example in a semiconductor manufacturing process, and an exposure method utilizing that photomask.

The photomask utilized in the semiconductor manufacturing process is comprised of a light-blocking film (such as chromium film) formed in the desired pattern on a glass substrate. To manufacture the semiconductor device, a photomask pattern is made by projecting light onto a semiconductor wafer formed with the photoresist film using photolithographic technology, the pattern developed and after forming a resist pattern on the semiconductor wafer, that resist pattern is utilized as a mask for processes such as etching base films.

The photomask is produced using photolithographic equipment so photolithographic data in other words, CAD (computer aided design) data is converted into data for the photolithographic equipment, and a light-blocking film faithfully reproduced by patterning it on the glass substrate based on this data. In the photolithographic process, the semiconductor wafer is exposed to light utilizing the photomask.

However, in the photolithography process used in manufacturing semiconductors, the interference effect from light becomes very strong due to the need for the line width to form a pattern in the vicinity of the light exposure wavelength, and a large discrepancy occurs between the design pattern and the transfer pattern so that the optical proximity effect becomes a problem. The optical proximity effect appears as phenomenon such as variations in line width of separate lines and repeating lines and in contraction of the line edges, bringing problems such as poor gate line width control and shrinking of alignment margins. In the same etching process, the etching bottom line width varies due to differences in taper angle according to differences in spaces between patterns, causing the phenomenon of poor control of gate line width.

These effects cause increased variations (irregularities) in transistor characteristics, and ultimately cause a drop in production of semiconductor chips and a drop in speed performance, exerting an extremely adverse effect on design margins involving production efficiency and chip performance. These problems become of special concern in 0.8 μm generation logic chips requiring high density so that correction values dependent on each space were determined ahead of time and improving the control of gate width line 1 attempted by corrections made over the entire chip. These corrections measures are called optical proximity effect correction (OPC) or process proximity effect correction (PPC).

FIGS. 13A and 13B are drawings of each of the photomasks 31 [311, 312] after optical proximity effect correction (OPC) or process proximity effect correction (PPC) and show the resist pattern images 35 [351, 352] exposed, developed and obtained by utilizing these photomasks 31 [311, 312]. A separate line 32 consisting of a section where the mask pattern and the line L are separate; and density line 33 consisting of a section where the line L and space S are repeating; are formed on the photomasks 31 [311, 312].

When exposing and developing with the precorrection photomask 311 formed of both separate line 32 and density line 33 of the same line width Wo in FIG. 13A, the resist line width of the resist pattern 351 is thicker in the section of the separate line 36.

In contrast, in FIG. 13B when exposing and developing with the postcorrection format mask 312 having separate lines 32 formed with a narrower line width than the density line 33, the resist line width of the resist pattern 352 becomes the same line width as both the separate line 32 and the density line 33.

A correction grid is first needed in order to clarify what mask corrections are required. The correction grid shows individual units for determining correction values (so-called mask correction units). In recent years, high precision mask lithographic equipment has become capable of wafer calculations (in other words, the dimensions when projecting light for exposure onto the wafer) down to lithographic grids of 0.5 nm (individual units for lithographic equipment). The correction grids themselves are also smaller, and the correction accuracy has been improved.

However, trying to reduce the correction grid scale to zero also brings the disadvantages of a tremendous increase in the number of man-hours for fabricating correction tables and an increase in processing time needed for OPC (optical proximity effect correction), and requires establishing a correction grid while dealing with correction accuracy in the overall system. Most studies tend only deal with OPC (optical proximity effect correction) in terms of data processing and do not cover to what extent the process can be improved by OPC (optical proximity effect correction), or to what extent gate line width can be limited.

However, making the correction grid as near to zero as possible does not guarantee that correction accuracy will improve and no standards exist for establishing such correction grids. There is also the misconception that bringing the correction grid size closer to zero will improve correction accuracy somewhat. Yet such a correction grid also brings the risk of wasting many man-hours and mask fee costs. Consequently, since there is no improvement in controlling the gate line width on the wafer, the situation of a poor product yield continues for a long time. Also design work will fail to grasp the actual potential of the process and the customer cannot be provided with a satisfactory semiconductor chip.

SUMMARY OF THE INVENTION

In view of the above described circumstances, it is therefore an object of the present invention to provide a method for establishing the values required for the correction grid and defining correction accuracy in optical proximity effect correction technology, as well as provide a photomask, and a high precision photomask fabrication method for improving control of line width on the wafer, and an exposure method utilizing that photomask.

The photomask fabrication method of the present invention establishes a correction grid and so-called mask correction units based on space dependency of patterns acquired by the photolithography process and etching process, and corrects photomask fabrication design data by using these mask correction units.

The photomask fabrication method of the present invention is capable of establishing mask correction units that are ideal for optical proximity effect correction and process proximity effect correction, because the fabrication method establishes a correction grid and so-called mask correction units based on space dependency of patterns acquired by the photolithography process and etching process. Photomasks can be fabricated and the number of man-hours required for fabricating the photomask can be reduced by correcting the design data utilizing these mask correction units as feedback. A photomask with improved control of line width on the wafer can therefore be fabricated.

The photomask of the present invention can therefore be fabricated by design data corrected using mask correction units established based on the space dependency of patterns acquired by the photolithography process and etching process.

The photomask present invention is a high precision photomask capable of achieving the necessary control of line width since the photomask is fabricated by design data corrected using mask correction units established based on the pattern space dependency.

The exposure method of the present invention performs light exposure on a wafer by utilizing the above described photomask.

The exposure method of the present invention is capable of controlling the line width of the exposure pattern on the wafer since the wafer is exposed to light by using the above described photomask.

BRIEF DESCRIPTION OF THE DRAWINGS

FIG. 2 is a structural view showing a typical essential portion of the correction table for describing the present invention.

FIG. 3 is a structural view showing another typical essential portion of the correction table for describing the present invention.

DETAILED DESCRIPTION OF THE PREFERRED EMBODIMENTS

The preferred embodiments of the present invention are next described while referring to the accompanying work drawings.

Figure 1:
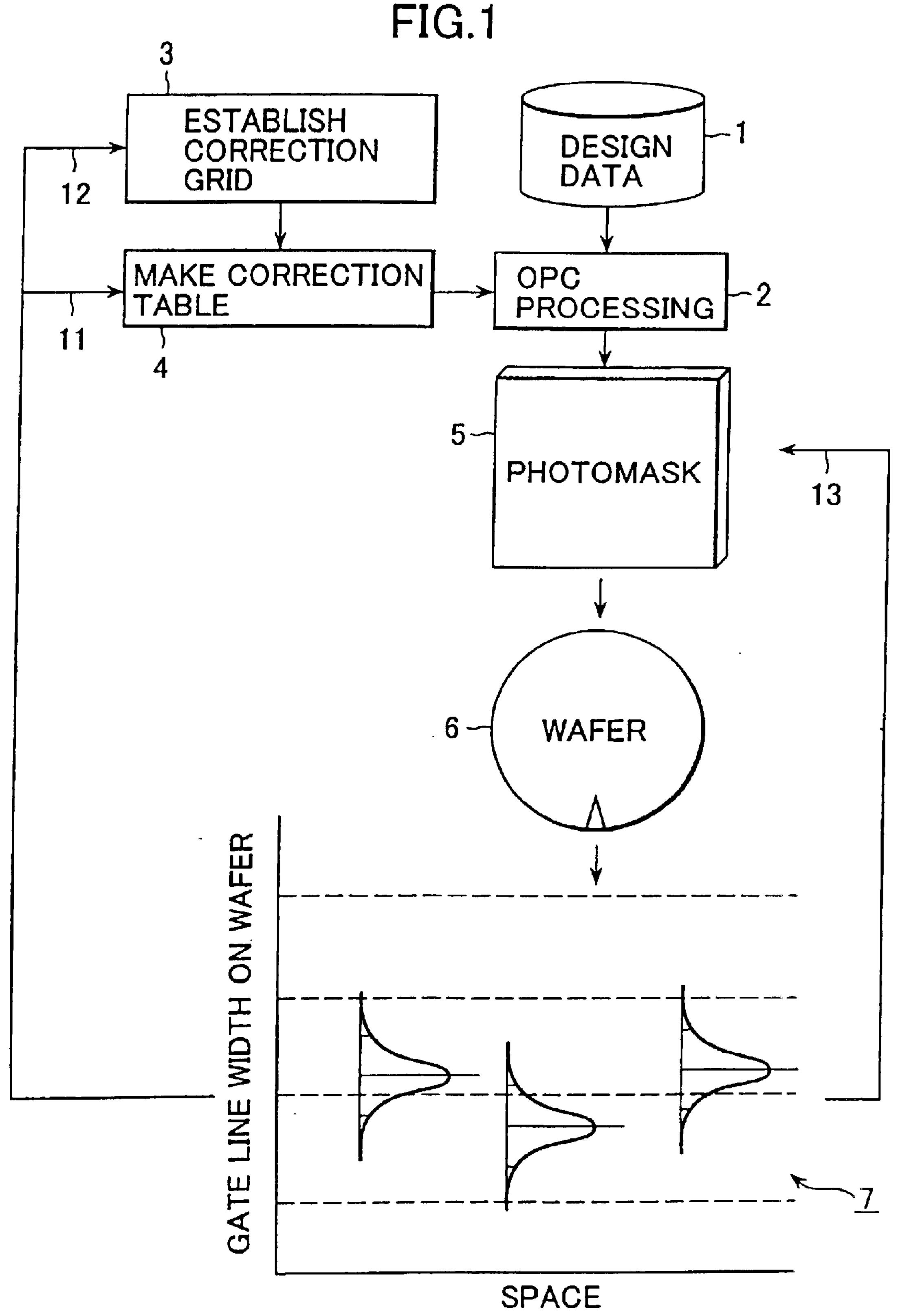
FIG. 1 is a flowchart showing the forming of the desired pattern on the wafer using the photomask fabrication method and photomask of the present invention.

FIG. 1 is a process flowchart showing the forming of the desired pattern on the wafer by utilizing the photomask and the photomask fabrication (method) of the present invention.

The photomask is fabricated in this example using lithographic equipment. In FIG. 1, the reference numeral 1 denotes the CAD data or in other words, the design data. The reference numeral 2 denotes the OPC (optical proximity effect correction) processing of the design data, reference numeral 3 denotes the correction grid (individual units to determine the correction values, so-called mask correction units). A reference numeral 4 denotes the correction table listed in the correction grid, and a reference numeral 5 denotes the photomask fabricated by the lithographic equipment based on OPC (optical proximity effect correction) processed data. The reference numeral 6 denotes the wafer exposed to light by the exposure equipment utilizing the photomask 5*m* developed and further etched to form the necessary pattern on the surface, and in the present example is a semiconductor wafer formed with gate electrodes of the required gate line width. The lithographic equipment is indicated where convenient for the photomask 5. The lithographic equipment is also indicated where convenient for the wafer 6.

The fabricating of the photomask of the present embodiment is first described.

The specified correction values are first set in the correction grid 3, and a correction table 4 made with the correction grid 3 having these initial correction values. The correction table $\mathbf{4}_1$ (Here, essential sections of the correction table when using a correction grid of 5 nm are shown. The space and the gate line width are within the figures listed in the table.) for example shown in FIG. 2 is made. OPC (optical proximity effect correction) processing 2 is performed on the design data 1 based on this correction table $\mathbf{4}_1$, the lithographic equipment is operated based on the OPC processed data and the photomask 5 is fabricated.

The photomask 5 generally uses a base material formed from a light blocking film such as chromium film and deposited in the required thickness on a transparent substrate such as a glass substrate, and a photoresist film formed on the chromium film, and an electron beam of the lithographic equipment is then made to scan to create (in other words, expose and develop) the required mask pattern on the photoresist film, and the chromium film selectively etched by way of the resist mask pattern.

The photoresist film on the wafer 6 is next exposed to light using the exposure equipment and the photomask 5 fabricated as described above. The resist mask filmed by developing (photolithography process) and a plurality of gate electrode arrays are formed by selective etching of a base film such as gate electrode material film (etching process) by using this photoresist mask.

Next, the lengths (or ends) of actual patterns having various spaces are measured on the wafer 6 within the chip, and the distribution (length measurement results) 7 of variations (irregularities) in gate line width for each space is obtained. In other words, the gate line width variations are sampled, and the dimension separation measured (described later on in FIG. 7).

Correction figures are already established for the various spaces so the average for each space is found, and if that average is less than twice the ±correction grid value (after correction the line width changes to twice that of the correction grid), then the correction results are determined to be correct and are used as conditions for fabricating the mask.

However, if the average in not within a figure less than twice the ±correction grid value, then the correction value is determined to be wrong, and the correction results of the correction table 4 are revised (corrected) based on the length measurement results 7 as shown in the path 11 of FIG. 1. In other words, corrected (revised from the correction figure surrounded by the square) for example from the correction table $\mathbf{4}_1$ of FIG. 2, to the correction table $\mathbf{4}_2$ of FIG. 3. If these correction results are limited to within less than twice the ±correction grid value, then these results are satisfactory and regarded as results corrected by the first correction grid (Described later on in FIG. 8). Attempting any further correction of the correction values has the opposite effect of making the overall variations (irregularities) even worse. Correction results determined to be satisfactory are used as conditions for fabricating the mask. OPC (optical proximity effect correction) processing 2 is performed on the design data 1 based on this correction table $\mathbf{4}_2$ corrected with these revised correction values, and the photomask 5 is fabricated.

The correction grid 3 must itself be changed when next limiting variations (irregularities) in the overall gate line width. In other words, as shown in the path 12 in FIG. 1, based on the length measurement 7, the correction grid 3 is changed into a correction grid having even smaller values than the initial correction grid (the correction grid is established based on the space dependency of the gate line width) and converted into a correction table 4 by using this changed correction grid 3. The correction table $\mathbf{4}_2$ of FIG. 3 for example is converted to the correction table $\mathbf{4}_3$ of FIG. 4. OPC (optical proximity effect correction) processing of the design data 1 is performed based on this correction table $\mathbf{4}_3$, and the photomask 5 is then fabricated. Variations (irregularities) in the overall gate line width can therefore be suppressed by using this photomask 5 (Described later on in FIG. 9).

Changes in the correction grid itself should be made without exceeding the grid values of the lithographic equipment.

Figures 4, 5:
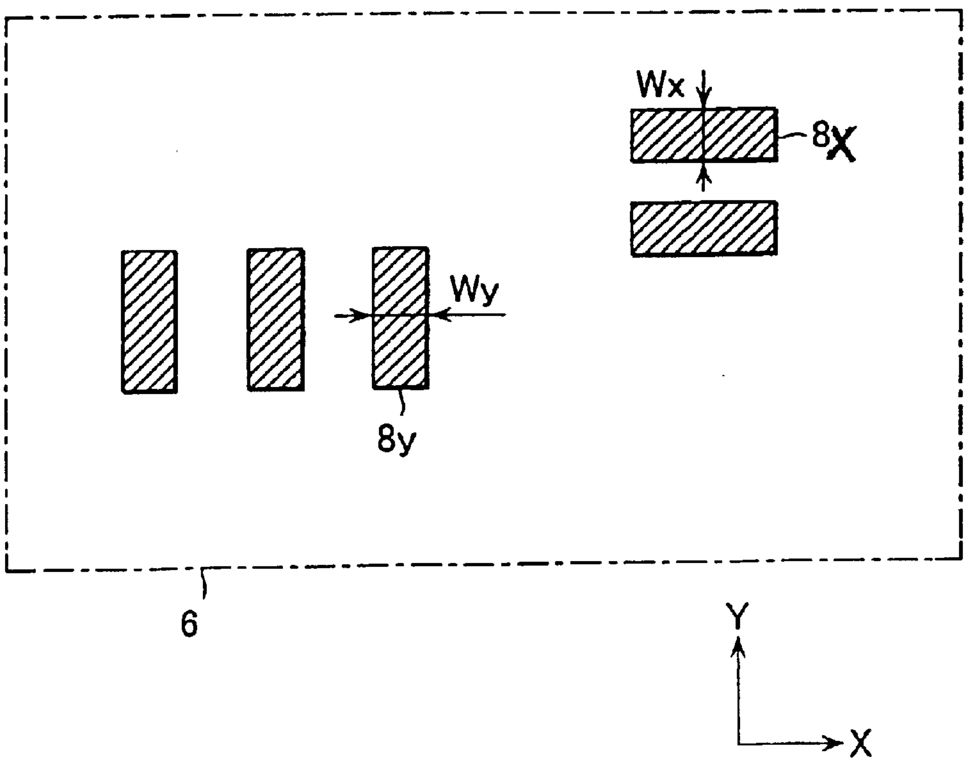
FIG. 4 is a structural view showing yet another typical essential portion of the correction table for describing the present invention.
FIG. 5 is a structural view of a gate line width in the X and Y directions on an actual gate pattern supplied for describing the present invention.

Gate electrodes as shown in FIG. 5 however, may sometimes have a mixture of a gate electrode 8*x* that is long in the X direction, and a gate electrode 8*y* that is long in the Y direction. In such cases, even if both gates are designed to have the same line width by means of the photomask, a differential will occur between the gate line width Wx of gate electrode 8*x* in the X direction and the gate line width Wy of gate electrode 8*y* in the Y direction.

The above mentioned correction table 4 is made for gate electrodes 8*x* and 8*y* (in directions X and Y) having the same conditions. Therefore, even if the correction grid is made to a smaller scale, there will be no improvement in the gate line controllability if the differential between the gate line widths Wx and Wy, or in other words the XY differential is large.

Whereupon, length measurement of the line width of the actual gate pattern having various spaces within the chip is performed (obtaining the length measurement 7) on the wafer 6 after it has undergone the previously described photolithographic and etching processes in FIG. 1. Correction values are established for each of the various spaces so an average is taken for each space, and if the average is within twice the ±correction grid value, then the correction results are determined to be satisfactory. Under the same conditions, an average of the gate line width Wx in the X direction and the gate line width in the Y direction is taken, and the XY differential evaluated. If the differential between X and Y is smaller than twice the ±correction grid value, then the XY differential of the photomask 5 is determined to be insignificant (See FIG. 10 described later on.).

However, if the XY differential is larger than twice the ±correction grid, then the XY differential of the photomask, or the XY differential of the exposure equipment is determined to be too high (See FIG. 11 described later on.). The parameter setting (for example, the quality assurance pattern, the aperture XY shift quantity, etc.) of the lithographic device 5 for making the mask based on the length measurement 7 as shown for example on the path 13 in FIG. 1 is corrected at this time. Further, the parameter settings (such as frame aberration, spherical aberration, synchronous precision, etc.) of the exposure equipment (matching the wafer position) 6 are corrected based on the length measurement 7 as shown for example on the path 13 in FIG. 1.

These corrections improve the correction accuracy even further, allowing a high precision gate pattern to be formed.

However, in the revision and changing of the correction table 4 on the paths 11, 12 of FIG. 1, and fabricating of a plurality of photomasks 5 with the same mask data, results from investigating the space dependency of each of the photomasks 5 reveal that the photomask fabrication process is capable of correcting actual gate line irregularities when the cause is factors such as the mask CD (critical dimension {in other words the mask line width itself}), the differential between light permeating the photomask transmittance (permeance) section and light penetrating the light blockage section, and the transmittance (permeance) rate of the photo mask light blockage section (in cases using a phase-shift type photomask).

In the case of a CD mask for example, corrections are achieved by changing for example the etching conditions of the chromium film forming the light blocking film for the photomask fabrication process. In the case of phase shift type photomasks, the chromium film thickness is changed to correct the phase shift differential and the transmittance rate of the light-blocking film.

In the present embodiment, after obtaining a wafer 5 with gate patterns having various spaces and with reduced gate line width irregularities, a semiconductor device is manufactured by additional necessary processes.

Figure 6:
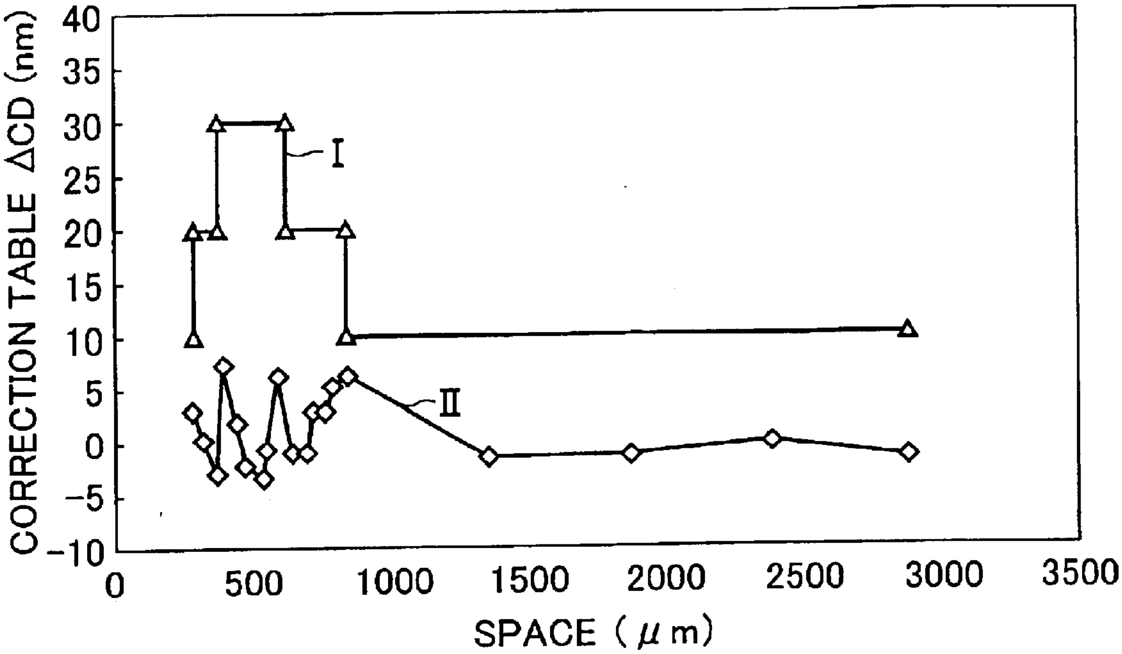
FIG. 6 is a graph showing the space correction values (correction table), and the differential (ΔCD) between the target line width and the line width after transfer and processing of those space correction values (correction table) for describing a working example of the present invention.

A specific example is next further described in detail. When fabricating a photomask, the correction table 4 is usually made before performing the OPC (optical proximity effect correction) processing 2, however the correction table 4 is written in correction grid units. Therefore, when developing a new process, a correction grid 3 must first be established. In this embodiment, the correction grid 3 is first set at 5 nm for example as the necessary value. In a correction grid 3 of 5 nm, by utilizing the space correction value (correction table 4) and the photomask 5 after those corrections, the line width after transferring (developing and processing) and etching of the wafer 6, is subtracted from the target line width (design line width) to achieve the value shown in FIG. 6. In FIG. 6, the curve I is the space correction value (correction table), curve II is the (Δ CD) differential between the line width after that transfer/processing and the target line width. Line width results depend on the five L/S (line/spaces) and the spaces are equal on both sides so it can be seen that a mask data will be 5 nm on one side and 10 nm on both sides.

The correction table 4 of FIG. 1 is made in this way.

OPC (optical proximity effect correction) processing 2 is next performed on the design data 1 based on this correction table 4, and the post-correction photomask 5 made by using the lithographic equipment.

After those corrections, the transfer (exposing, developing) and etching of the wafer 6 is performed using lithographic equipment containing the photomask 5, and a plurality of gate electrodes are then formed on the wafer. Sampling of the gate line irregularities is performed at this time, and the dimensional separation in each space is measured and the results are shown in the example in FIG. 7. It can be seen on looking at FIG. 7 that the gate line width equivalent to a space of 1.7 micrometers is narrow compared to the overall figure. The thick line is the average value for each space from the length measurement results.

Figure 7:
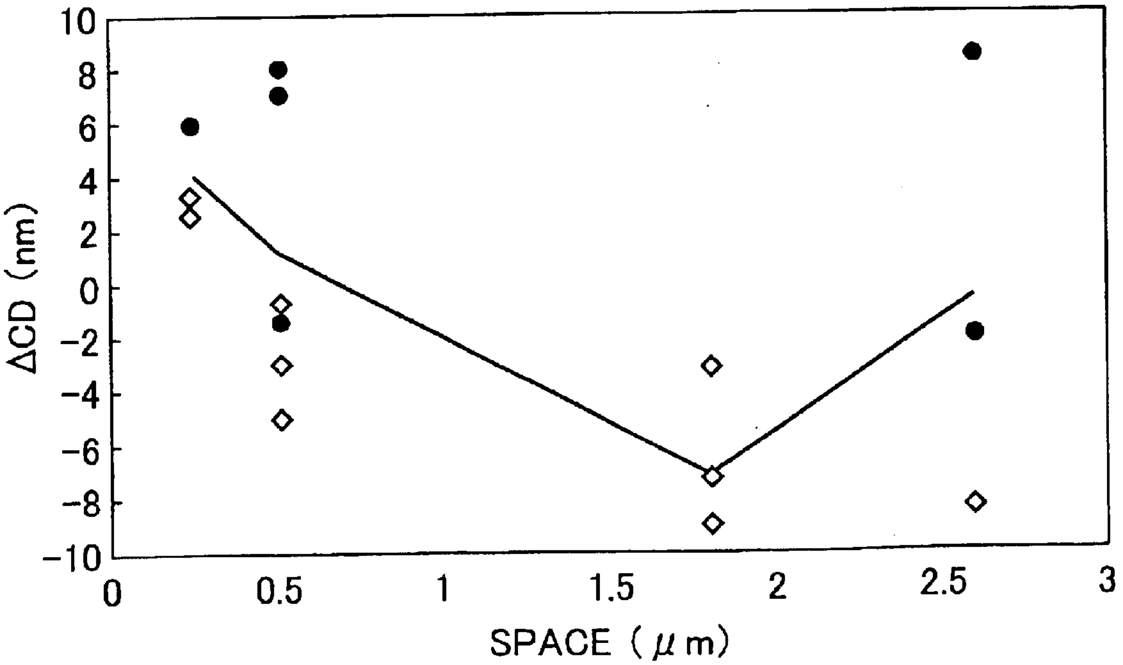
FIG. 7 shows a graph requiring correction by correction values on a 5 nm correction grid supplied for describing a working example of the present invention.

Data in FIG. 7 allows predicting that gate line width variations are improved for all spaces by adding a correction value of 1.7 micrometers of 5 nm on one side and 10 nm on both sides. In other words, the correction accuracy can be improved by revising the correction value. However, revisions of correction values should be judged based on sufficient data so that variations (irregularities) occurring in the mask, shot process and wafer will not be reflected here. In other words, FIG. 7 shows an example where revision of correction values is possible on a 5 nm correction grid.

Figure 8:
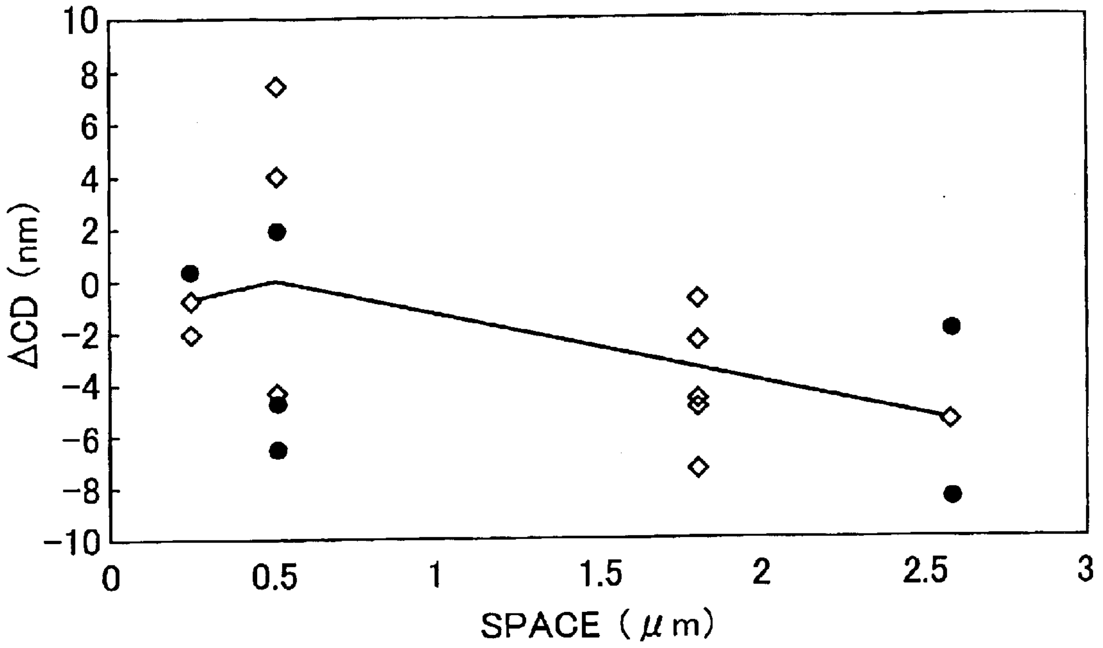
FIG. 8 is a graph corrected by correction values on a 5 nm correction grid supplied for describing a working example of the present invention.

An example of improving gate line width correction accuracy by revising the correction values of this correction table 4 is shown in FIG. 8. In other words, the data in FIG. 7 was fed back to the correction table 4, and revised on the 5 nm correction grid, and OPC (optical proximity effect correction) processing 2 performed on the design data 1 based on this revised correction table 4, and a post-correction mask 5 fabricated. Transfer and etching are performed using this photomask and the results of FIG. 8 obtained.

Of the results shown in FIG. 8, the total gate line width irregularities (variations) must be limited and the correction accuracy must be further improved. In this case, the 2.5 micrometer space is narrower than others, so when a correction value equivalent to the 2.5 micrometer space is made thicker by 5 nm on one side and 10 nm on both sides, the gate line width of the location with the 2.5 micrometer space conversely becomes too thick. In other words, the correction values on the 5 nm correction grid of FIG. 8 should not be revised. To restate this in other words, FIG. 8 shows an example where the correction values on the 5 nm correction grid are correct.

Figure 9:
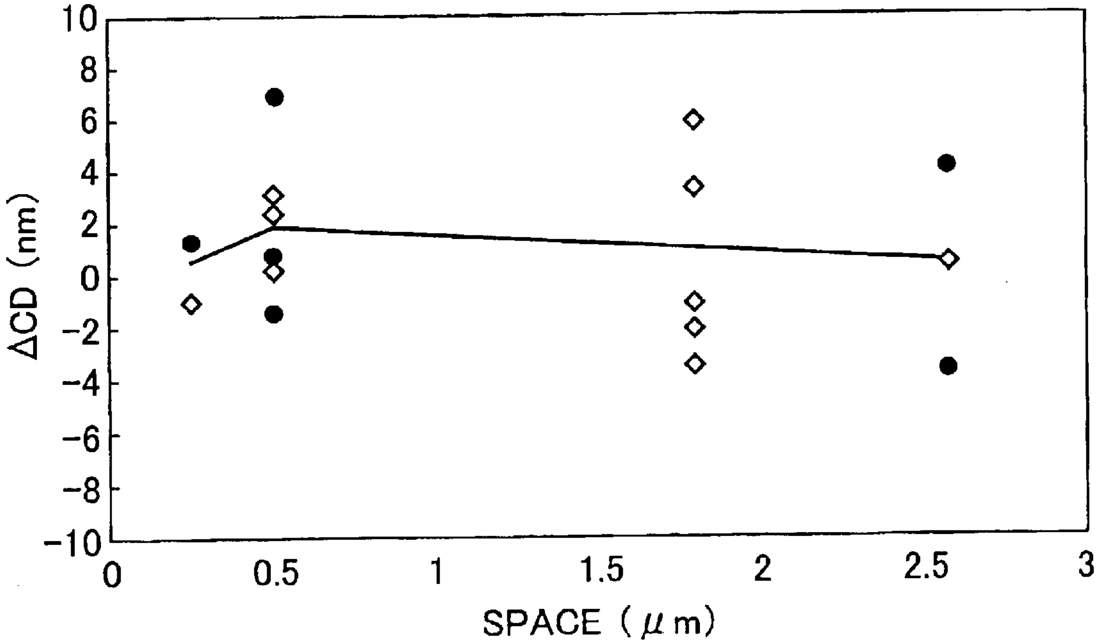
FIG. 9 is a graph corrected by correction values on a 2.5 nm correction grid supplied for describing a working example of the present invention.

If even further improvement of gate line width irregularities is desired, the use of a smaller correction grid can be evaluated. FIG. 9 shows an example of optimizing the correction values to further reduce gate line irregularities of FIG. 8.

In other words, the data in FIG. 8 is fed back to the correction grid 3 and changes made to a 2.5 nm correction grid. The correction table 4 is changed using that changed correction grid, and OPC (optical proximity effect correction) processing 2 performed on the design data 1 based on this revised correction table 4, and a post-correction mask 5 fabricated. Etching and developing are performed using this photomask and the results of FIG. 9 obtained. FIG. 9 is an example of proper correction values on a 2.5 nm correction grid.

Correction accuracy is logically determined by a figure twice the correction grid. Conversely, if the correction accuracy as an average value for all spaces is within twice the ±correction grid value, then the correction value is not judged to be a problem. However, spaces determined to be important for transistor control, or spaces having many transistors may be driven to obtain strict correction results particularly by sampling and changes in space divisions. In fact, the correction grids of both FIG. 8 and FIG. 9 achieve a correction accuracy of one-fold. Evaluating space dependency of the gate line width on a chip in this way, allows deciding whether or not revising the correction value is needed, and evaluating the effect of reducing the correction grid size.

The relation of OPC (optical proximity effect correction) processing and photomask specifications are described next.

Length measurement of the actual gate pattern is performed the same as previously described. Correction values for each of the various spaces are established so an average is taken for each space, and if the average is within twice the ±correction grid, then the correction results are determined to be satisfactory. An example is shown in FIG. 10.

Figure 10:
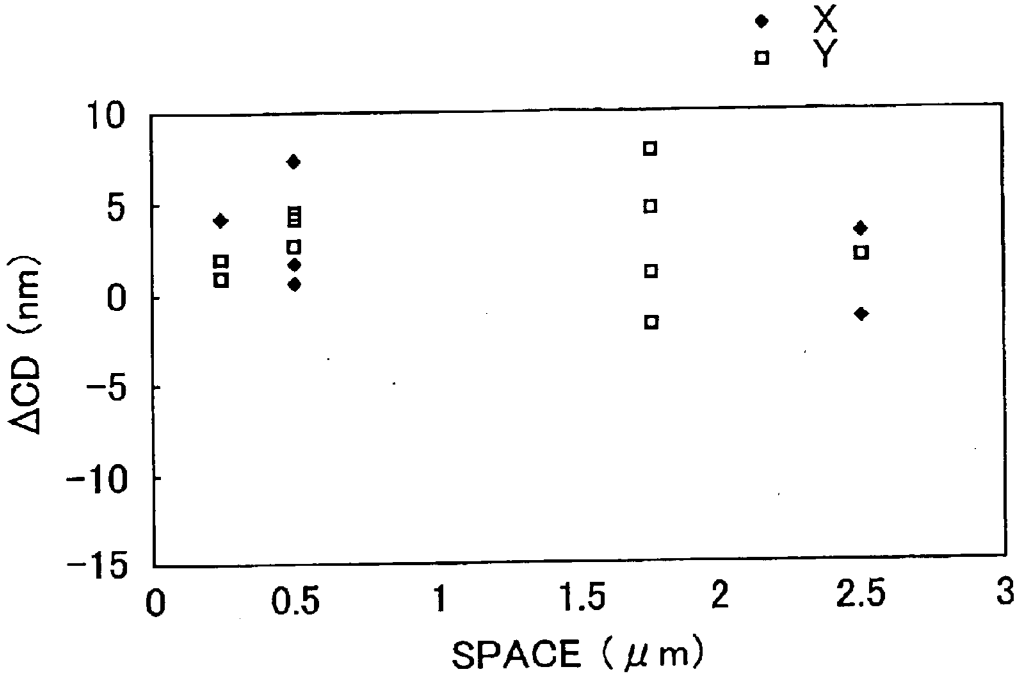
FIG. 10 is a graph showing a small differential in the X and Y directions by means of correction accuracy check results supplied for describing a working example of the present invention.
Figure 11:
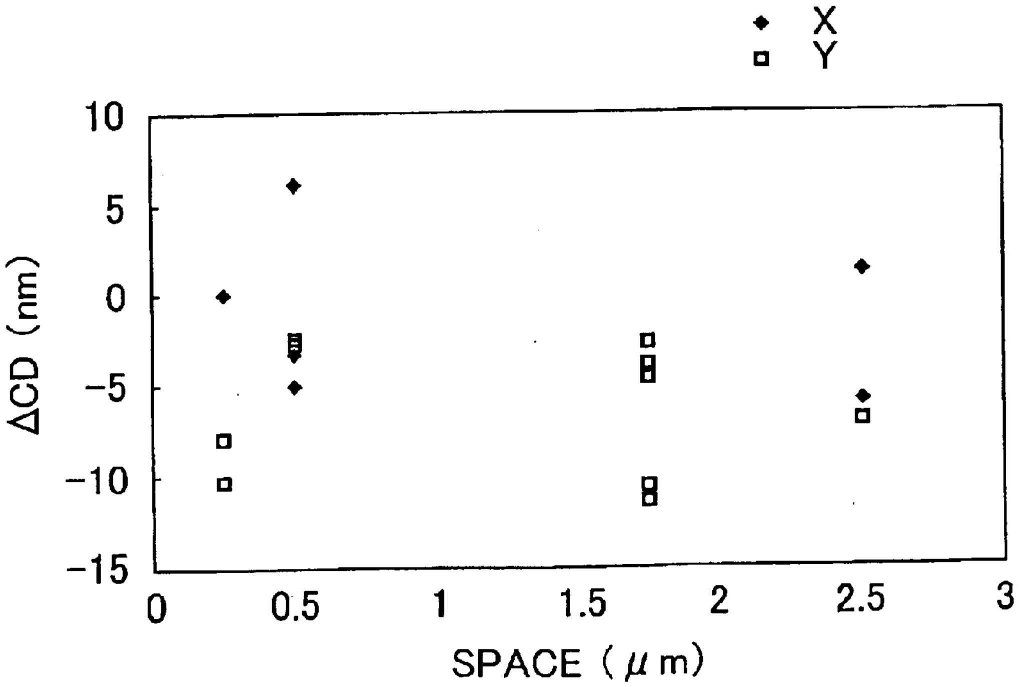
FIG. 11 is a graph showing a large differential in the X and Y directions by means of correction accuracy check results supplied for describing a working example of the present invention.

Regardless of the fact that the correction results were determined to be satisfactory, when next fabricating a mask with the same mask data, the results as shown in FIG. 11 were obtained. These results occurred because the total gate line width variations became worse than in FIG. 10. Examining the data in FIG. 10 and FIG. 11 in detail shows that only the gate line width (See line width Wy of FIG. 5) in the Y direction has become narrower in the layout on FIG. 11. If the results in FIG. 11 are products with gate line width irregularities exceeding the design tolerance, then the photomask shipping criteria must be made stricter.

In other words, FIG. 10 shows an example having a small XY differential according to the correction accuracy check results. FIG. 11 shows an example having a large XY differential according to the correction accuracy check results.

Figure 12A:
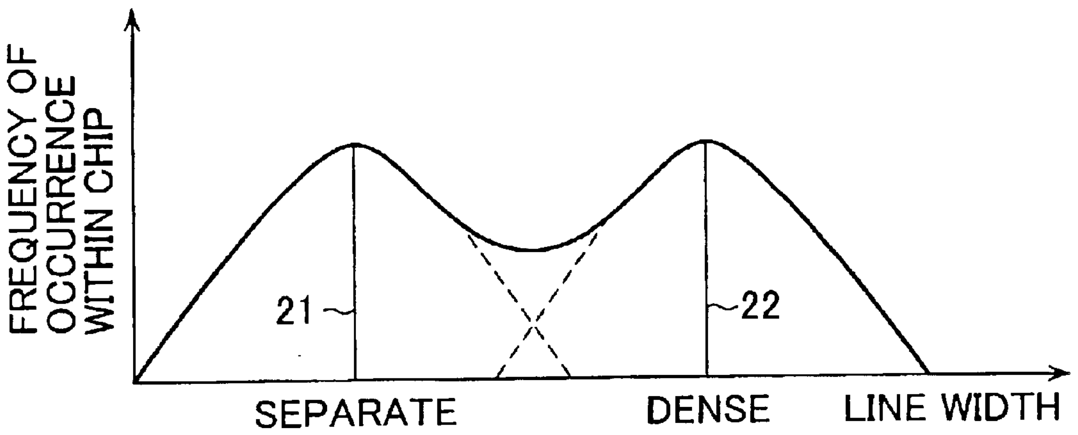
FIG. 12A is a graph showing the differential occurring between the line width of the density line and the separate line among the gate line width frequency of occurrence in the chip for describing the present invention.

Specifications involving correction grids and the XY differential were described above. The interrelation of the correction grid and XY differential are shown in FIG. 12. The state in FIG. 12A shows the separate line and the density line widely separated within the overall gate line width irregularities (or variations). The two vertical lines 21 and 22 are the respective average values. The average values for separate line and the density line patterns can be brought closer by OPC (optical proximity effect correction) processing. However, that value is limited to within twice the correction grid.

Figure 12B:
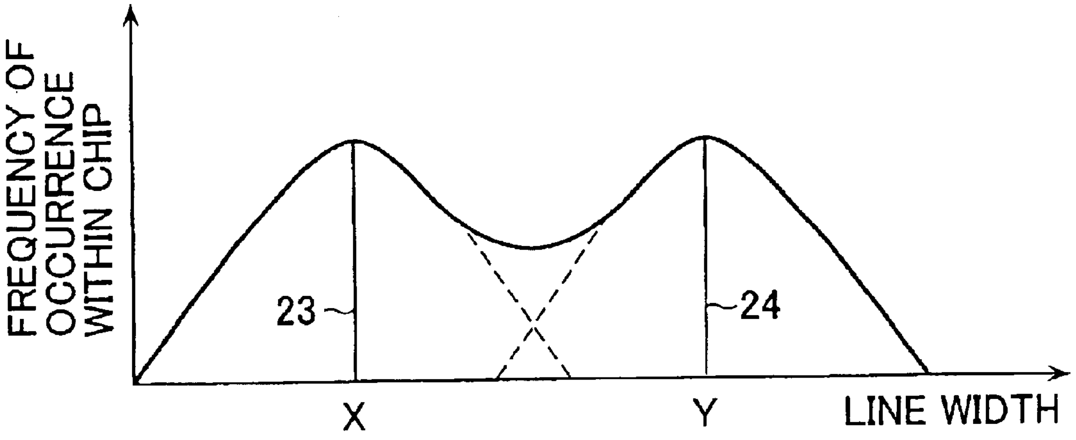
FIG. 12B is a graph showing an example of the differential in X and Y line width occurring among the gate line width frequency of occurrence in the chip for describing the present invention.
Figure 13A:
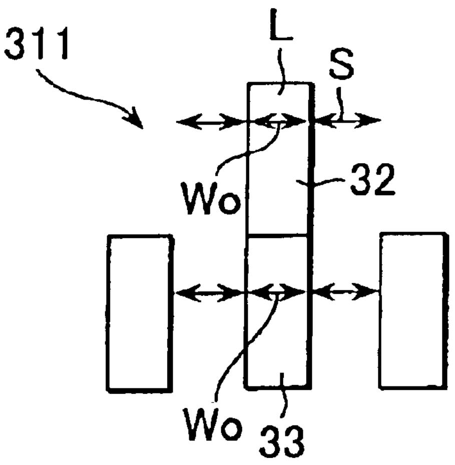
FIG. 13A is a drawing for showing the precorrection pattern mask and the resist pattern image.
Figure 13B:
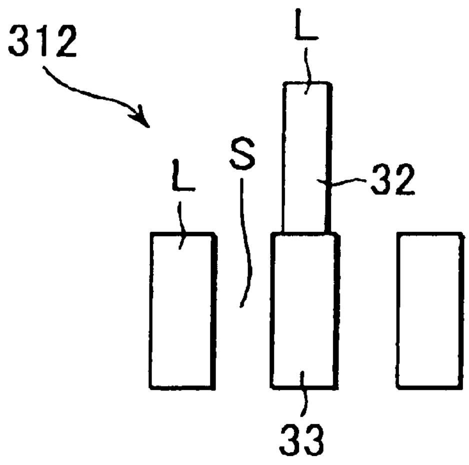
FIG. 13B is a drawing for showing the postcorrection pattern mask and the resist pattern image.
Figure 13B:
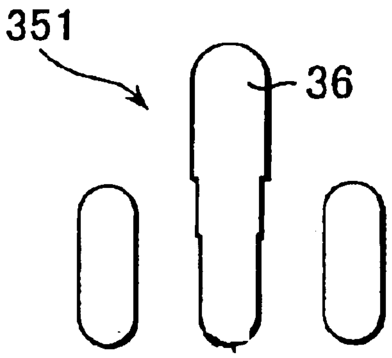
Figure 13B:
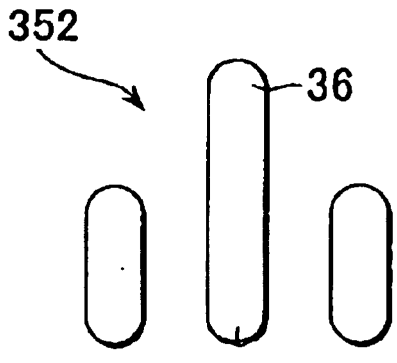

FIG. 12B on the other hand, shows the X and Y direction gate line widths widely separated. The two vertical lines 23 and 24 are the respective average values.

It can be seen that FIG. 12A and FIG. 12B both show the same effects per overall gate line width irregularities. The effects of the XY differential are the same for various factors such as the mask CD (critical dimension) lithography CD, and exposure equipment.

Correction accuracy in other words, is greatly affected by the overall mask and wafer process performance, and the two cannot be treated separately.

Attempting to achieve a correction accuracy greater than the performance of the mask and wafer processes, by making a finer correction grid therefore presents problems.

The embodiments as described above, allow establishing a correction grid suitable for use with optical proximity effect correction (OPC) and process proximity effect correction (PPC) when fabricating photomasks, and achieving the required gate line width control.

A photomask can therefore be obtained that delivers improved gate line width controllability on wafers so that a high precision chip (semiconductor device) can be manufactured, and the production yield also improved.

A chip can be designed that adequately takes both the design margin and the process margin into account, and that satisfies the customer with a sufficient supply of chips.

Along with clearly specifying the optical proximity effect correction (OPC) and process proximity effect correction (PPC) accuracy, specifications can also be clearly specified for controlling the photomask dimensions, and the man-hours required for fabricating photomasks can be reduced.

The photomask fabrication method of the present invention is therefore capable of establishing a correction grid usable with optical proximity effect correction (OPC) and process proximity effect correction (PPC) when fabricating photomasks, and capable of achieving the required gate line width control.

The present invention along with clearly specifying the optical proximity effect correction (OPC) and process proximity effect correction (PPC) accuracy, can also clarify the specifications for controlling the photomask dimensions, and reduce the man-hours required for fabricating photomasks.

The photomask of the present invention achieves improved gate line width controllability on wafers and allows designing a semiconductor chip that takes both the design margin and the process margin into account, so that a semiconductor chip capable of satisfying the customer can be manufactured, and the semiconductor chip can further be provided in sufficient quantities.

The exposure method of the present invention utilizes the photomask obtained by the above described fabrication method so that patterns can be exposed to light with high accuracy, and consequently a highly accurate pattern can be formed on the wafer after the photolithography process and etching process. A semiconductor chip capable of satisfying the customer can therefore be manufactured, and that semiconductor chip can further be provided in sufficient quantities.

What is claimed is:

1. A photomask fabrication method, wherein mask correction units are established, and the mask correction units for photomask fabrication are corrected based on a comparison of the mask correction units with respect to actual measured variation of a manufactured structure from a desired structure, wherein the mask correction units are comprised of a plurality of individual correction values each of which correspond to a location having a desired line width for each of a plurality of lines.

2. A photomask fabrication method according to claim 1, wherein along with correcting said mask correction units, parameter settings for lithographic equipment are corrected according to an XY differential of a resultant pattern.

3. A photomask fabricated by design data revised using mask correction units, wherein the mask correction units are determined by measuring variation of a manufactured structure from a desired structure.

4. A photomask according to claim 3, wherein said mask correction units, are corrected in order to minimize an XY differential of a resultant pattern.

5. A photomask according to claim 3, wherein said mask correction units are used to minimize an XY differential of a resultant pattern with respect to a desired pattern.

6. The photomask fabrication method according to claim 1, wherein actual length measurement results are used to revise the mask correction units.

7. The photomask of claim 3, wherein actual length measurement results are used to revise the mask correction units.

8. The photomask fabrication method according to claim 1, wherein a correction grid and correction table on which optical proximity effect correction processing has been performed are utilized.

9. The photomask of claim 3, wherein a correction grid and correction table are utilized.

10. The photomask fabrication method according to claim 1, wherein if a measured average is not within less than twice absolute value of the mask correction value, the mask correction unit in a correction table is revised.

11. The photomask of claim 3, wherein if a measured average is not within less than twice absolute value of the mask correction value, the mask correction unit in a correction table is revised.

12. The photomask fabrication method according to claim 1, wherein an average of a line width in the X direction and a line width in the Y direction is determined, and if a differential between the measured value is greater than twice the absolute value of the mask correction unit, the mask correction unit in a correction table is revised.

13. The photomask of claim 3, wherein an average of a line width in the X direction and a line width in the Y direction is determined, and if a differential between the measured value is greater than twice the absolute value of the mask correction unit, the mask correction unit in a correction table is revised.

* * * * *